(12) United States Patent
Shiga

(10) Patent No.: US 8,843,674 B2
(45) Date of Patent: Sep. 23, 2014

(54) SEMICONDUCTOR MEMORY DEVICE CAPABLE OF TESTING SIGNAL INTEGRITY

(71) Applicant: Kabushiki Kaisha Toshiba, Tokyo (JP)

(72) Inventor: Hitoshi Shiga, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/958,038

(22) Filed: Aug. 2, 2013

(65) Prior Publication Data

US 2014/0244864 A1  Aug. 28, 2014

Related U.S. Application Data

(60) Provisional application No. 61/769,540, filed on Feb. 26, 2013.

(51) Int. Cl.
*G06F 13/10* (2006.01)
*G06F 3/06* (2006.01)

(52) U.S. Cl.
CPC ............ *G06F 3/0619* (2013.01); *G06F 3/0679* (2013.01); *G06F 3/0659* (2013.01)
USPC .............................................. 710/36; 710/72

(58) Field of Classification Search
None
See application file for complete search history.

(56) References Cited

U.S. PATENT DOCUMENTS

| | | | |
|---|---|---|---|
| 7,145,799 B2 * | 12/2006 | Naso et al. | 365/185.04 |
| 7,451,366 B2 * | 11/2008 | Youn et al. | 714/718 |
| 7,859,900 B2 * | 12/2010 | Hsiao et al. | 365/185.09 |
| 7,869,290 B2 * | 1/2011 | Ohtake | 365/201 |
| 7,929,372 B2 * | 4/2011 | Han et al. | 365/230.06 |
| 8,369,163 B2 * | 2/2013 | Song | 365/189.17 |
| 8,576,600 B2 * | 11/2013 | Lee et al. | 365/49.17 |
| 2001/0022744 A1 | 9/2001 | Noda et al. | |
| 2003/0156455 A1 | 8/2003 | Nakamura et al. | |
| 2007/0109856 A1 * | 5/2007 | Pellicone et al. | 365/185.09 |
| 2008/0065937 A1 * | 3/2008 | Micheloni et al. | 714/711 |
| 2010/0124110 A1 | 5/2010 | Shiga et al. | |
| 2010/0208519 A1 | 8/2010 | Shiga et al. | |
| 2012/0155172 A1 * | 6/2012 | Watanabe et al. | 365/185.09 |
| 2013/0051152 A1 * | 2/2013 | Lee et al. | 365/185.18 |

* cited by examiner

*Primary Examiner* — Cheng-Yuan Tseng
(74) *Attorney, Agent, or Firm* — Holtz Hotlz Goodman & Chick PC

(57) ABSTRACT

According to one embodiment, a semiconductor memory device includes a memory cell array, a first buffer, a second buffer, an interface unit and a controller. Data is transferred between the interface unit and the first buffer. The controller controls the first buffer, the second buffer and the interface unit. When receiving a first command and first data at a test time, the controller transfers the first data to the first buffer via the interface unit. When receiving a second command as a dummy command, the controller reads second data from the memory cell array to the second buffer and, at the same time, outputs first data held in the first buffer via the interface unit.

10 Claims, 12 Drawing Sheets

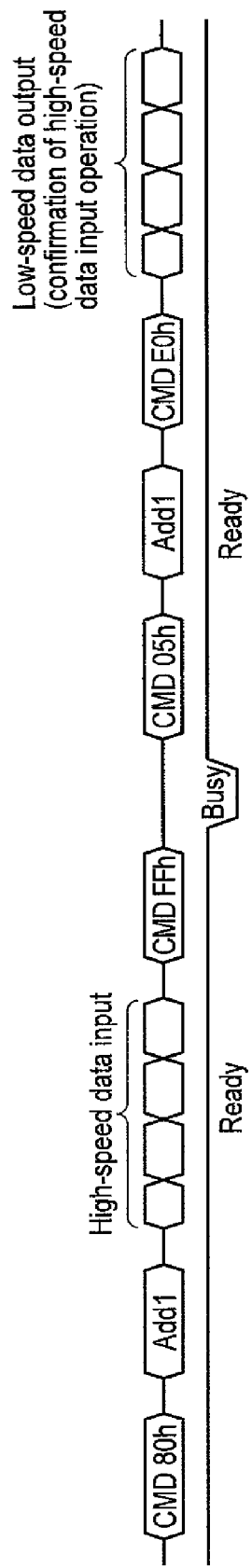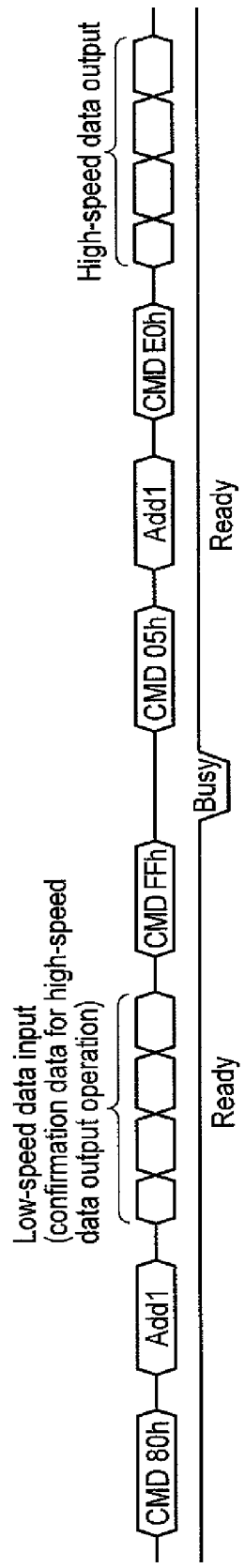
F I G. 2 A
F I G. 2 B

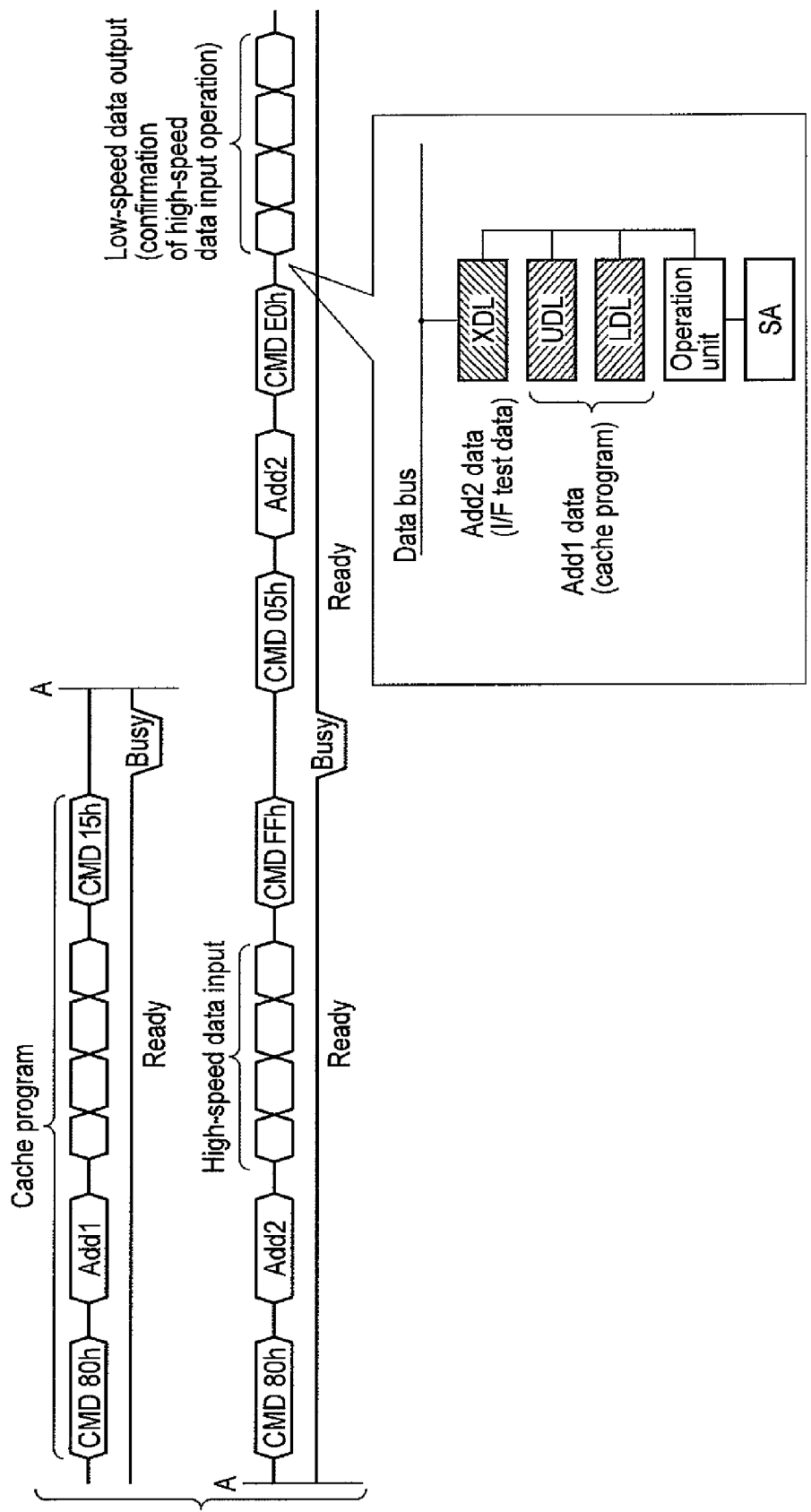
F I G. 5

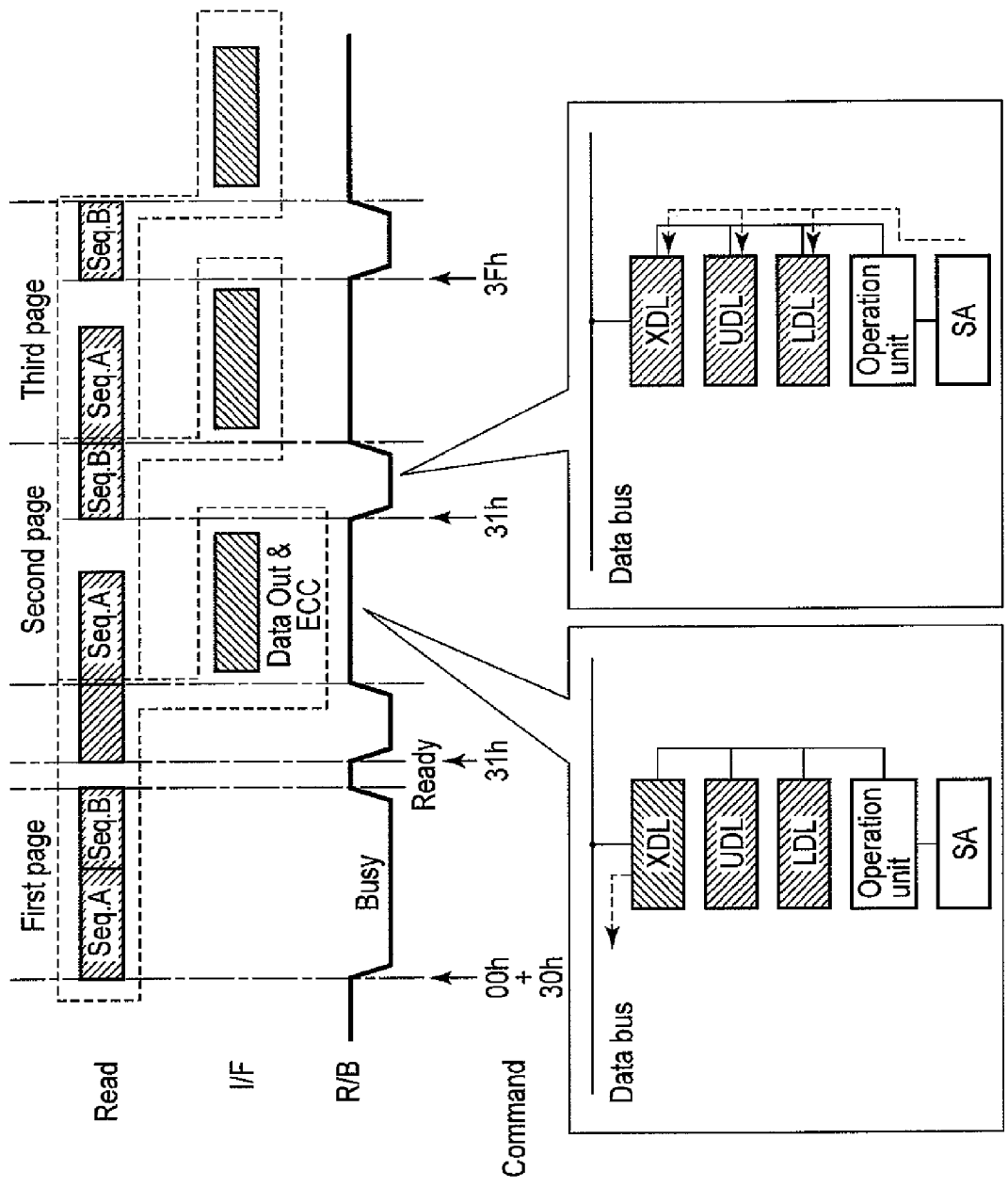
F I G. 6

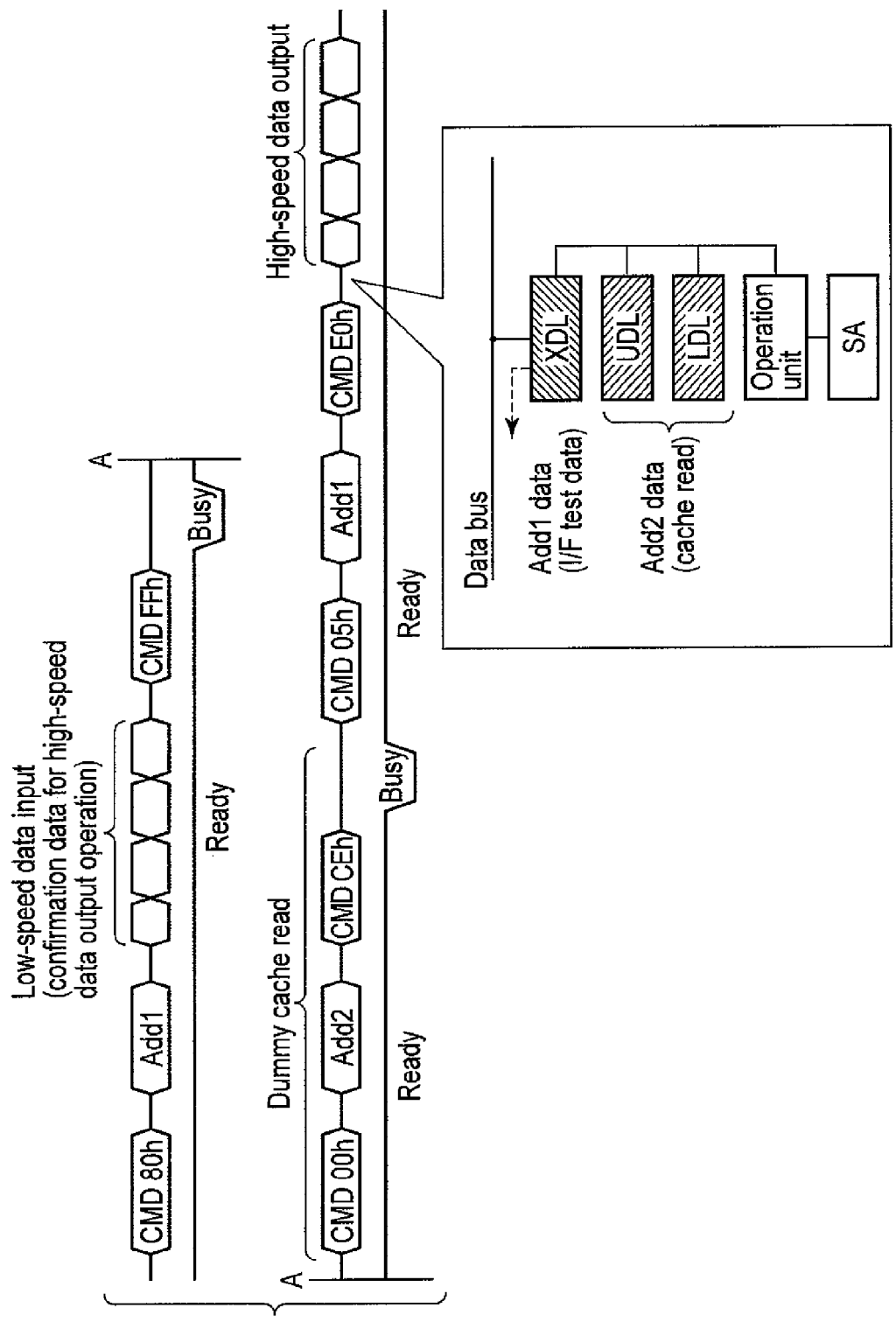
F I G. 7

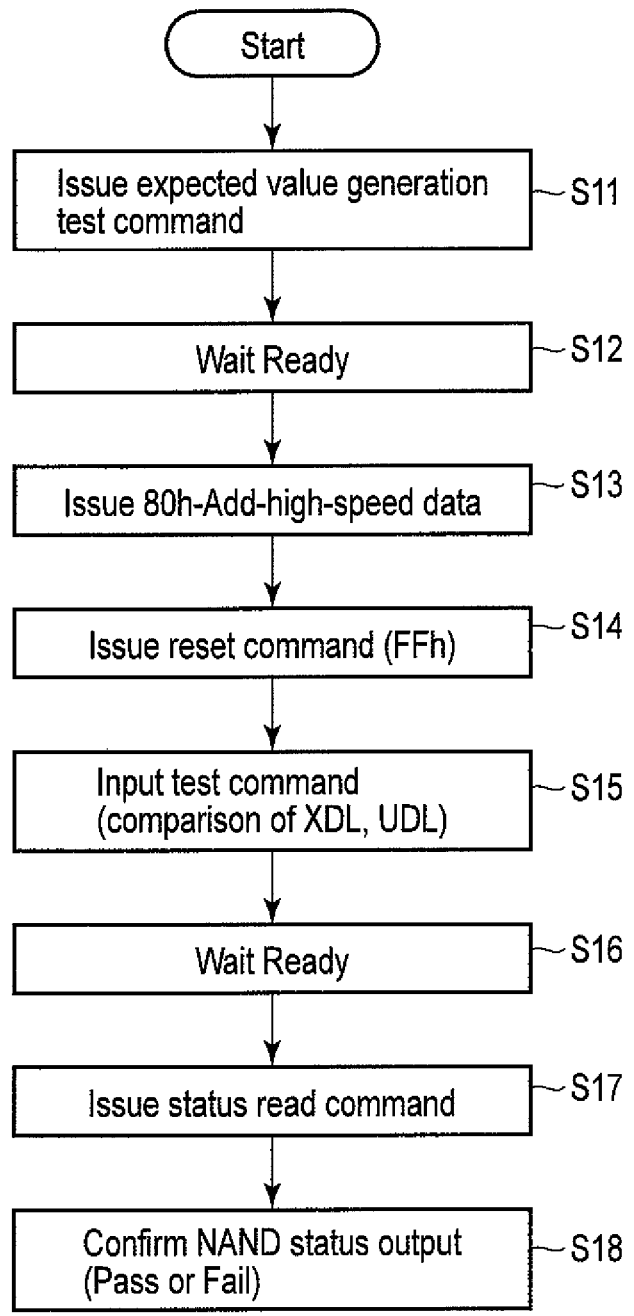
F I G. 10

US 8,843,674 B2

SEMICONDUCTOR MEMORY DEVICE CAPABLE OF TESTING SIGNAL INTEGRITY

CROSS-REFERENCE TO RELATED APPLICATIONS

This application claims the benefit of U.S. Provisional Application No. 61/769,540, filed Feb. 26, 2013, the entire contents of which are incorporated herein by reference.

FIELD

Embodiments described herein relate generally to a test for signal integrity of a semiconductor memory device, for example, a NAND flash memory.

BACKGROUND

Conventionally, since a high-speed interface is not required in a NAND flash memory, it is not necessary to make a test for signal integrity after mounting.

Recently, the operating speed of the interface of a NAND flash memory has increased. The signal integrity in the high-speed interface is important and it is necessary to evaluate the signal integrity in a package/board on which the NAND flash memory is mounted.

BRIEF DESCRIPTION OF THE DRAWINGS

FIGS. 2A, 2B are timing charts showing examples of a test sequence in which no memory cell is used.

FIG. 5 is a timing chart showing the test operation at the cache program time.

FIG. 6 is a timing chart showing the cache read operation.

FIG. 7 shows a first embodiment and is a timing chart showing the test operation at the cache read time.

FIG. 10 is a flowchart for illustrating the high-speed data input test operation in the second embodiment.

DETAILED DESCRIPTION

In general, according to one embodiment, a semiconductor memory device includes a memory cell array, a first buffer, a second buffer, an interface unit and a controller. Data is transferred between the interface unit and the first buffer. The controller controls the first buffer, the second buffer and the interface unit. When receiving a first command and first data at a test time, the controller transfers the first data to the first buffer via the interface unit. When receiving a second command as a dummy command, the controller reads second data from the memory cell array to the second buffer and, at the same time, outputs first data held in the first buffer via the interface unit.

The test for determining whether or not data is correctly input to the memory and whether or not data is correctly output from the memory can generally be made by writing data to the memory and verifying whether or not data read from the memory coincides with that written.

However, since data read from the NAND flash memory is not ensured by 100% depending on the characteristic of the memory, the data may sometimes contain an error. Therefore, the error must be corrected by means of an error correction circuit. As a result, it becomes impossible to distinguish between inversion of data caused by a lowering in the signal integrity of the interface and inversion of data caused by the characteristic of the memory cell. Therefore, it is desired to make it possible to perform a test for the signal integrity caused by the interface.

The present embodiment is explained below with reference to the drawings.

First Embodiment

Figure 1:
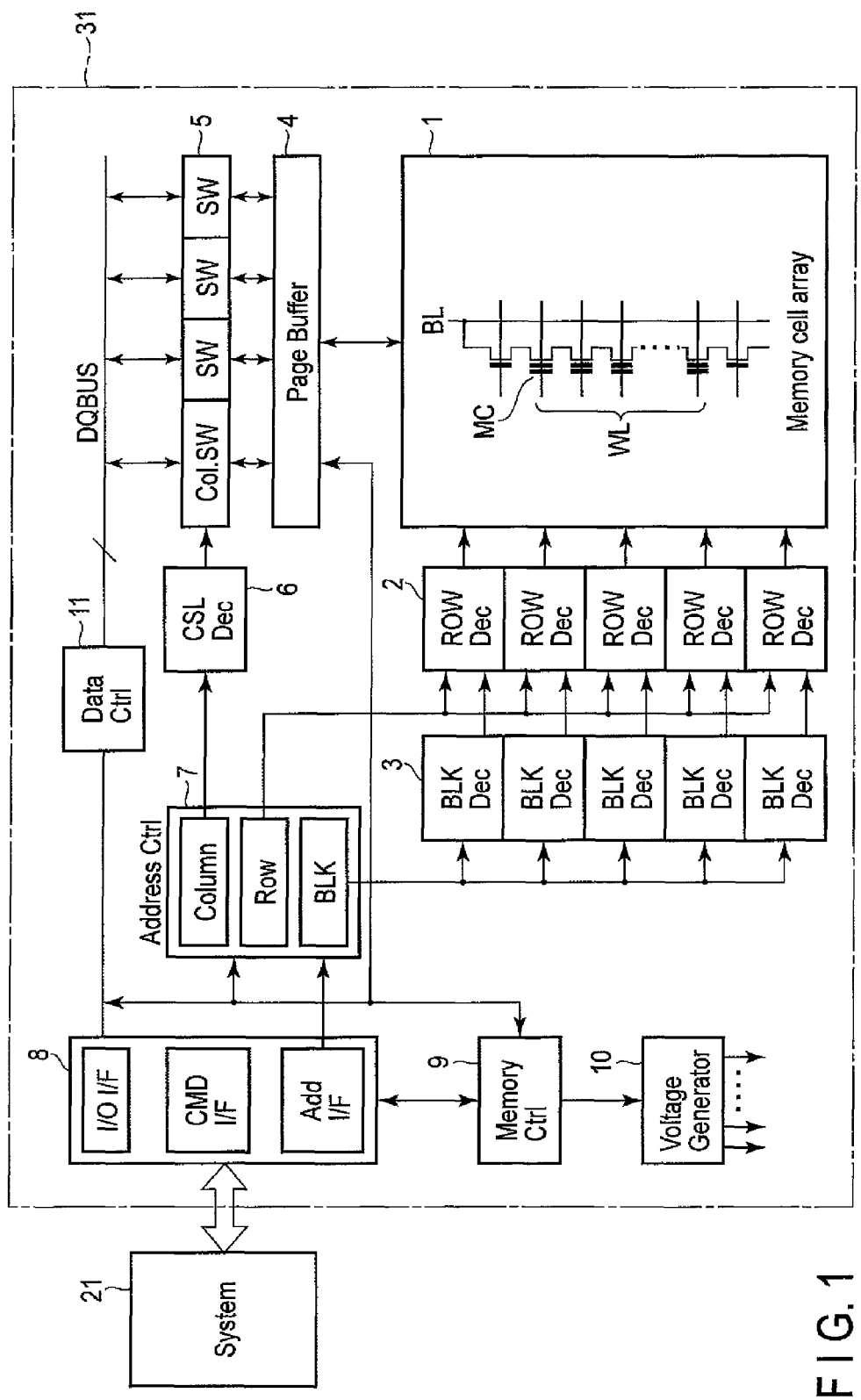
FIG. 1 is a block diagram schematically showing one example of a semiconductor memory device applied to one embodiment.

FIG. 1 is a block diagram showing a semiconductor memory device, for example, a NAND flash memory applied to the present embodiment.

In FIG. 1, a NAND flash memory 31 is connected to a system 21 (for example, a host device or controller chip).

The NAND flash memory 31 includes a memory cell array 1, row decoder 2, block decoder 3, page buffer 4, column switch 5, column decoder 6, address controller 7, interface unit 8, memory controller 9 used as a control unit and voltage generator 10.

The memory cell array 1 includes a plurality of memory cells MC configuring NAND strings and memory cells MC are connected to word lines WL and bit lines BL. A plurality of NAND strings arranged in the row direction configure a block and the memory cell array 1 includes a plurality of blocks.

The block decoder 3 decodes a block address supplied from the address controller 7.

The row decoder 2 selectively activates word lines WL based on a column address supplied from the address controller 7 and an output signal of the block decoder.

The column decoder 6 decodes a column address supplied from the address controller 7. The column switch 5 selectively activates bit lines BL based on an output signal of the column decoder 6.

The page buffer 4 holds write data supplied from the interface unit 8 via the data controller 11 and column switch 5 and data read from the memory cell array 1. The page buffer 4 is explained later in detail.

The interface unit 8 includes an I/O interface (I/O I/F) dealing with write data and read data, a command interface (CMD I/F) dealing with various commands and an address interface (Add I/F) dealing with a write address and read address.

The interface unit 8 decodes a command issued from the system 21 and supplies the result to the memory controller 9, transfers an address supplied from the system 21 to the address controller 7, transfers data supplied from the system 21 to the data controller 11 and transfers data supplied from the data controller 11 to the system 21.

The memory controller 9 controls the whole portion of the NAND flash memory 31 and generates various control signals.

The voltage generator 10 generates voltages required for data programming, reading, erasing and the like based on the control operation of the memory controller 9.

To-be-evaluated objects in the signal integrity test of the high-speed interface are a data path stretching from the system 21, interface unit 8 and data controller 11 to the page buffer 4 via the column switch 5 shown in FIG. 1, address controller 7 and column decoder 6.

(Test Sequence 1)

FIGS. 2A, 2B show examples of a test sequence in which the memory cell array 1 is not used.

FIG. 2A shows a test sequence in an example of a high-speed data input test. In this example, a test is made to determine whether or not data input according to a high-speed (high-frequency) clock signal is correctly transferred to the page buffer 4 shown in FIG. 1. In this example, data is supplied to the page buffer 4 according to a program command sequence using data load command "80h" ("h" indicates a hexadecimal number).

That is, the system 21 sequentially outputs command "80h", address "Add1" and evaluation data used as expected value data. The NAND flash memory 31 transfers data to the page buffer 4 according to command "80h".

Then, the system 21 issues reset command "FFh". The NAND flash memory 31 interrupts the data load process without executing the program to the memory cell according to reset command "FFh". At this time, a Busy signal is output from a Ready/Busy pin (hereinafter referred to R/B pin) pin (not shown) of the NAND flash memory 31.

After this, the system 21 issues data output command "05h", address "Add1" and execution command "E0h" to output data held in the page buffer 4. At this time, the NAND flash memory 31 outputs data held in the page buffer 4 according to a low-speed (low-frequency) clock signal.

The system 21 compares the input expected value data (evaluation data) with data output from the NAND flash memory 31. When both data items coincide with each other or the degree of similarity between the data items is greater than or equal to a preset reference value, it can be evaluated that the test path is operating correctly.

According to the above test, the to-be-evaluated circuit between the interface unit 8 and the page buffer 4 can be tested without performing data writing and reading with respect to the memory cell.

FIG. 2B shows a command sequence in an example of a high-speed data output test. The basic idea of this example is the same as that of FIG. 2A, and operation confirmation data used as expected value data is previously transferred to the page buffer 4 by using a low-speed clock signal and data is output to the system 21 from the page buffer 4 by using a high-speed clock signal and compared with an expected value in the system 21. The command sequence is the same as that of FIG. 2A.

FIGS. 2A, 2B each illustrate the test sequence in which the memory cell array 1 is not used. However, it is necessary to evaluate noise caused by the operation of the memory cell array 1 such as cache programming, cache reading that will be next explained to make a test for the high-speed data transfer operation by means of a circuit in the NAND flash memory 31 shown in FIG. 1.

(Configuration of Page Buffer)

Figures 3A, 3B:
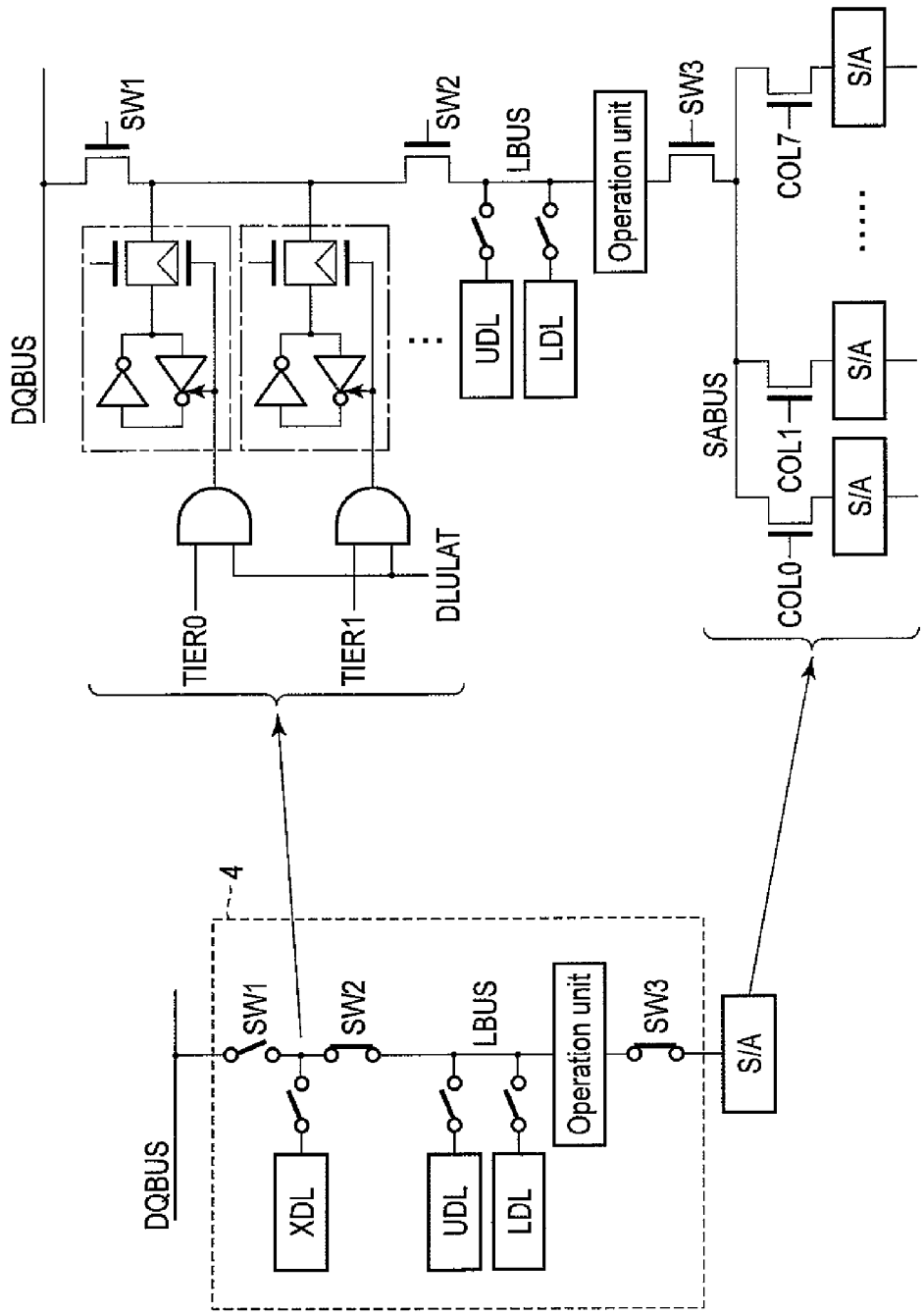
FIG. 3A is a configuration diagram showing one example of a page buffer shown in FIG. 1
FIG. 3B is a circuit diagram concretely showing FIG. 3A.

FIG. 3A shows the more detailed configuration example of the page buffer 4 shown in FIG. 1 and shows the configuration corresponding to one of the columns of the page buffer 4.

In FIG. 3A, XDL indicates a data latch used at the data transfer time and data latches UDL and LDL, operation unit and sense amplifier (S/A) are used for the write and read operations with respect to the memory cell.

FIG. 3B shows the configurations of data latch XDL and S/A of FIG. 3A in detail.

For example, since the low threshold voltage distribution among a plurality of threshold voltage distributions is not sufficiently written in the initial period of the write operation at the multi-value data write time, data latches XDL, UDL and LDL are all used. When the write operation proceeds and the low threshold voltage distribution is sufficiently written, data held in data latch XDL becomes unnecessary for the write operation and is made free. Therefore, next write data can be transferred to data latch XDL in the middle course of the data write operation. As a result, a cache program can be executed by using data latch XDL as a cache memory.

When data is read from the memory cell, the read data is sequentially transferred to data latches LDL, UDL and XDL and data held in data latch XDL is output to the exterior. While data held in data latch XDL is being output to the exterior, a cache read operation can be performed by reading data from the memory cell and sequentially transferring the same to data latches LDL and UDL.

(Test Sequence 2)

Figure 4:
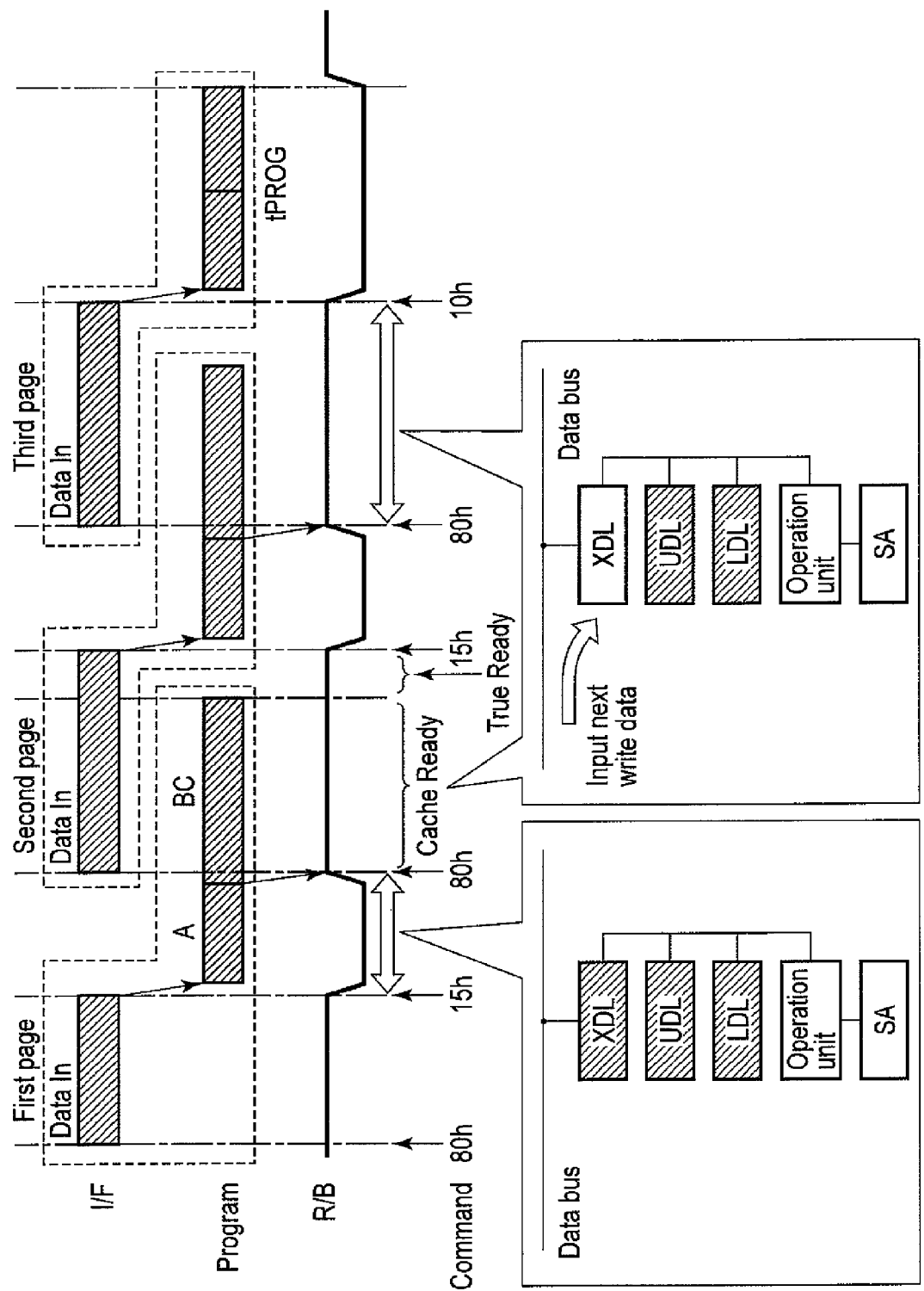
FIG. 4 is a diagram showing one example of the data flow of a cache program.

FIG. 4 shows one example of the data flow of a cache program.

In the case of this example, it is assumed that 3-bit data is stored in one memory cell and the 3-bit data is transferred to the page buffer 4 in the page unit. In this case, for example, the page corresponds a plurality of memory cells simultaneously selected by means of one word line.

FIG. 4 shows a data transfer system (interface: a path stretching from the system 21 shown in FIG. 1 to the page buffer (XDL) 4) when three pages are successively written in the order of a first page, second page and third page, a program operation (page buffer: a path of XDL, UDL, LDL, S/A), the state of the R/B pin and the timing of an input command (an address is omitted).

As shown in FIG. 4, write data of the first page supplied to the interface unit 8 is first transferred to XDL according to load command "80h". If execution command "15h" is issued, the write operation with respect to the memory cell is started. At the write time, the capacity of a required data latch is determined based on a write system. In the case of the example shown in FIG. 4, data latches XDL, UDL and LDL are first occupied. In this state, the R/B pin is set to the Busy state.

When the data write operation of the first page proceeds to some extent, one page of the data latch can be made free. In this case, data latch XDL is made free and the R/B pin is set to the Ready state. At this time, since data latch XDL is made free although the write operation to the memory cell continues in the NAND flash memory 31, the system 21 can transfer data of the second page to data latch XDL.

Further, since data latch XDL is made free when the data write operation of the second page proceeds to some extent, the system 21 can transfer data of the third page to data latch XDL.

The write performance can be enhanced according to a cache program by simultaneously performing the write to the memory cell and the input of data of the second and third pages.

(Test at Cache Program Time)

FIG. 5 shows a case wherein the data integrity is tested when high-speed data is input at the same time as the program operation at the cache program time.

First, the cache program is started by using data of the first page. That is, data of the first page is transferred to data latch XDL used as the page buffer 4 based on data load command 80h and address Add1. Then, execution command 15h is issued from the system 21.

If the R/B pin is set to the Ready state according to execution command 15h, data of the first page is written in the memory cell and data of the second page is transferred to data latch XDL according to a high-speed clock signal during the write operation like the above case.

When data transfer is completed, the system 21 issues reset command FFh without issuing program execution command 15h to interrupt the cache program sequence. After this, the R/B pin is set to the Busy state by interruption of the program sequence.

Since data of the second page input according to the high-speed clock signal is held in data latch XDL in this state, the R/B pin is set to the Ready state.

Next, command "05h", address Add2 and command "E0h" used to output data of the page buffer are executed and data is output to the system 21 according to a low-speed clock signal. The system 21 compares the output data with data (expected value) of the second page input according to a high-speed clock signal.

According to the above test sequence, the input path stretching from the interface circuit 8 to the page buffer 4 can be tested by a high-speed data input operation under a condition that noise caused by executing a cache program is generated.

(Cache Read)

FIG. 6 shows the data flow of the cache read operation. The cache read operation is a function of enhancing the read performance by simultaneously performing the data read operation and data transfer operation.

The cache read operation is schematically explained with reference to FIG. 6.

FIG. 6 shows the read operation when data items of the first, second and third pages are successively read from the memory cell array 1 (the path stretching from the sense amplifier to XDL of the page buffer), data transfer system (the path stretching from XDL to the system 21), the state of the R/B pin and command (address input is omitted).

First, when read commands "00h" and "30h" are issued from the system 21, data items of the first, second and third pages are successively read based on the commands in the NAND flash memory 31. That is, data of the first page is first read from the memory cell array 1 and the thus read data of the first page is held in data latch XDL.

After this, when cache read command "31h" is issued from the system 21, the command is executed in the NAND flash memory 31, the preprocess is performed not to use data latch XDL and the R/B pin is set to the Ready state.

Next, data of the second page is read from the memory cell array 1. That is, data of the second page is read from the memory cell array 1 by means of the sense amplifier, LDL and UDL. At this time, data of the first page held in data latch XDL is transferred to the system 21 via the interface unit 8.

After this, when cache read command "31h" is issued from the system 21, data of the second page is transferred to XDL and the R/B pin is set to the Ready state.

Then, data of the third page is read from the memory cell array 1. That is, data of the third page is read from the memory cell array 1 by means of the sense amplifier, LDL and UDL. Like the above case, data of the second page held in data latch XDL is transferred to the system 21 via the interface unit 8 while data of the third page is being read from the memory cell array 1 in the NAND flash memory 31.

Further, if data of the second page held in data latch XDL is transferred to the system 21, data of the third page read from the memory cell array 1 is held in data latch XDL.

Next, if cache read command "3Fh" is issued from the system 21, data of the third page held in data latch XDL is transferred to the system 21 via the interface unit 8 in the NAND flash memory 31.

As described above, in the cache read operation, the read operation of data from the memory cell array 1 and the transfer operation of data held in the page buffer 4 are simultaneously performed.

(Test at Cache Read Time)

On the other hand, the test at the cache read time in the first embodiment is made to output data that is input to the page buffer from the exterior from the page buffer to the exterior without reading data from the memory cell. When data is output from the page buffer to the exterior, noise caused by performing a dummy cache read operation is added thereto.

Figure 8:
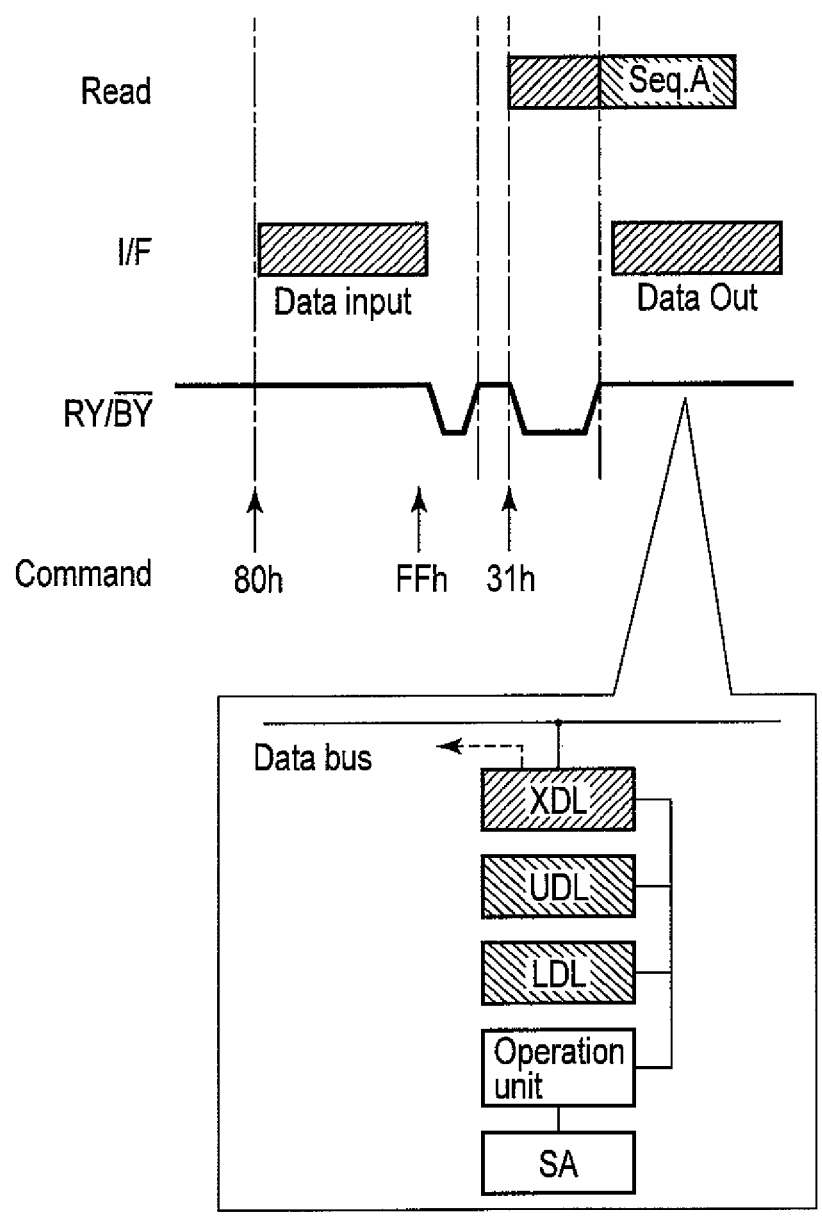
FIG. 8 is a timing chart showing part of the data flow of FIG. 7.

FIG. 7 and FIG. 8 show the test operations at the cache read time in the first embodiment. Specifically, FIG. 7 shows a command sequence when the high-speed data output test is made under a condition that noise caused by performing a dummy cache read operation is generated and FIG. 8 shows the data flow at this time.

As shown in FIG. 7, first, command "80h" and address "Add1" indicating the data write operation are issued from the system 21 and then evaluation data (that is hereinafter also referred to as test data) is supplied to data latch XDL by means of a low-speed clock signal. After this, command "FFh" is issued from the system 21 to reset the data load process.

Next, a test cache read command, that is, dummy cache read command is issued. Specifically, command "00h", address "Add2" and command "CEh" indicating the test operation, for example, are issued from the system 21. The NAND flash memory 31 transfers the read data to data latch LDL or UDL without transferring the data to data latch XDL based on the dummy cache read command. Therefore, since the NAND flash memory 31 does not use data latch XDL when receiving the dummy cache read command from the system 21, the memory temporarily outputs Busy to the R/B pin, then outputs Ready and successively executes the internal read sequence.

At the same time of execution of the internal read sequence, the NAND flash memory 31 executes command sequence "05h" to "E0h" in which data of the page buffer 4 issued from the system 21 is output. That is, at the same time as execution of the read sequence, test data held in data buffer XDL is output to the system 21 by means of a high-speed clock signal.

The system 21 compares data output from the NAND flash memory 31 with expected value data (test data) to evaluate the data.

Thus, the operation of the circuit stretching from the interface unit 8 other than the memory cell array 1 to the page buffer 4 can be tested by transferring test data at low speed to the page buffer 4 via the interface unit 8 and transferring data held in the page buffer 4 at high speed to the system 4 via the interface unit 8 under a condition that noise caused by performing a cache read operation is generated.

According to the first embodiment, the NAND flash memory 31 transfers evaluation data at high speed to the page buffer 4 according to a data load command issued from the system 21, then reads data from the memory cell array 1 according to a dummy cache read command issued from the system 21 and transfers the data to the buffer. At the same time as the data read operation, data held in the page buffer 4 is transferred to the system 21 via the interface unit 8. Therefore, when data held in the page buffer 4 is transferred to the system 21, noise can be generated in the dummy cache read operation. As a result, the system 21 compares evaluation data output from the NAND flash memory 31 with an expected value and if evaluation data is correct, it can be determined that the circuit stretching from the interface unit 8 to the page buffer 4 is operating correctly without being affected by noise.

Further, since data held in data buffer XDL is not data read from the memory cell, the reliability of the circuit stretching from the interface unit 8 to the page buffer 4 can be determined even in a case wherein the reliability of the memory cell is not 100%. Therefore, the signal integrity can be precisely evaluated in the package/board on which the NAND flash memory 31 is mounted.

Second Embodiment

In the first embodiment, test data of the interface is supplied from the system 21 to the NAND flash memory 31. On the other hand, in the second embodiment, a generation circuit that generates test data of the interface and a comparison circuit that compares transferred data with an expected value are provided in the NAND flash memory.

Test data used for evaluation of the interface has some representative test patterns depending on the wiring configuration in the memory and for memory system mounting. Therefore, the high-speed interface test can be efficiently made by implementing a previously expected test pattern generation function and a function of comparison between XDL and UDL, for example, as a test pattern on the NAND flash memory.

Figure 9:
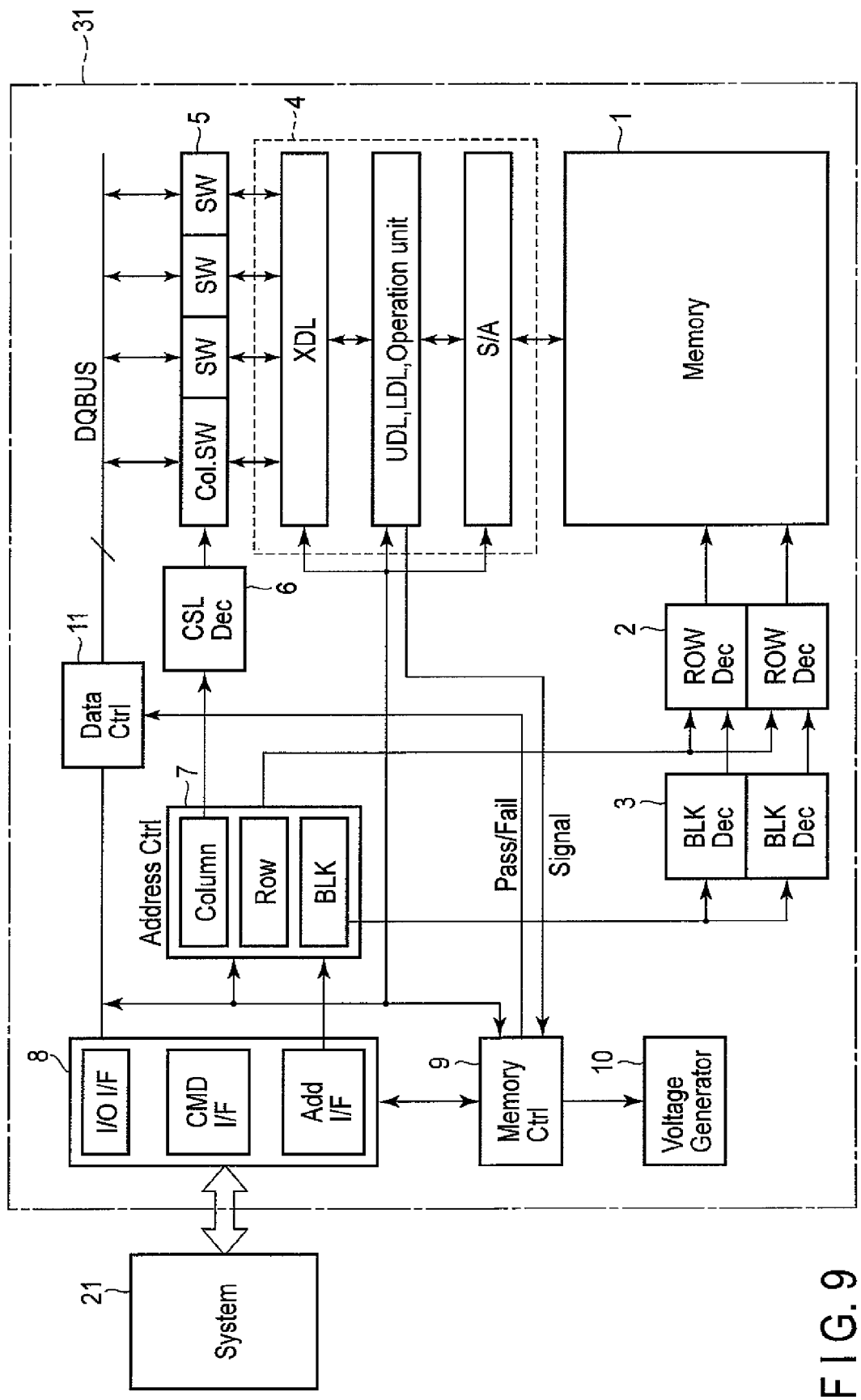
FIG. 9 is a configuration diagram of a NAND flash memory according to a second embodiment.

FIG. 9 shows the configuration of the NAND flash memory 31 according to the second embodiment. In FIG. 9, portions that are the same as those of FIG. 1 to FIG. 8 are denoted by the same symbols.

Unlike the case of FIG. 1, in FIG. 9, a memory controller 9 controls a column address controller 7 and data controller 11 and further controls data buffers XDL, UDL, LDL, operation unit and sense amplifier (S/A).

The generation circuit is configured by the memory controller 9, for example, and expected value data or test data is generated by means of the memory controller 9 at the test time.

The comparison circuit is configured by an operation unit provided between the sense amplifier and LDL, for example. The operation unit compares data items held in data buffers XDL and UDL, for example, and outputs a Pass/Fail signal used as a determination signal indicating whether or not data items held in data buffers XDL and UDL coincide in the whole page to the memory controller 9.

(High-Speed Data Input Test)

FIG. 10 is a flowchart for illustrating the high-speed data input test operation in the second embodiment. The flowchart shows a sequence of operations of the system 21.

First, a command that instructs generation of an expected value is issued from the system 21 (S11). A command interface contained in the interface unit 8 of the NAND flash memory 31 decodes a command issued from the system 21 and the memory controller 9 starts the expected value generation operation according to the result of decoding in the command interface.

Specifically, the memory controller 9 controls the column address controller 7 and data controller 11 and supplies an expected value to data buffer XDL. That is, the memory controller 9 generates expected value data, for example, and the expected value data is supplied to data buffer XDL specified by the column address controller 7 via the data controller 11.

The expected value is generally a pattern of, for example, "FFh"-"00h"-"FFh"-"00h" or "55h"-"AAh"-"55h"-"AAh" in which bit data is alternately and repeatedly changed in the order of "1"→"0"→"1"→"0" for each column address.

The expected value data held in data buffer XDL is transferred to data buffer UDL.

The NAND flash memory 31 is set to the Busy state and the R/B pin is set to the Busy state while the expected value data is being generated. Therefore, the system 21 is set to the standby state to wait until the R/B pin becomes Ready (S12).

Next, a data load command sequence is executed like the case of FIG. 2A, for example, to test the interface (S13). That is, the operation of issuing command 80h and address Add1 and the operation of inputting data according to a high-speed clock signal are sequentially performed. The NAND flash memory 31 transfers test data supplied via the interface unit 8 to data buffer XDL that configures the page buffer 4. The test data is the same as the expected value data explained before. After completion of data input, reset command "FFh" is issued from the system 21 and the process is interrupted (S14).

In the above state, test data of the high-speed interface is held in data buffer XDL and the expected value data is held in data buffer UDL.

After this, a test command for comparing the test data items held in data buffers XDL and UDL with the expected value data is issued (S15). The test command is decoded by means of the command interface of the interface unit 8 and the memory controller 9 controls data buffers XDL, UDL and the operation unit according to the result of decoding in the command interface to calculate the logical exclusive OR (XOR) of data buffers UDL and XDL. The XOR calculation operation is performed for the whole page. The operation unit determines whether or not the results of the XOR calculation operation are all set to "0". If the results are all set to "0", a Pass signal is supplied to the memory controller 9 and if all of the results are not set to "0", a Fail signal is supplied to the memory controller 9. For example, the memory controller 9 sets a status register (not shown) based 10, on the Pass/Fail signal.

The NAND flash memory 31 is set to the Busy state and the R/B pin is set to the Busy state while the above operation is being performed. Therefore, the system 21 is set to the standby state to wait until the R/B pin becomes Ready (S16).

After completion of the operation, a status command used to read the status is issued from the system 21 (S17). The memory controller 9 outputs status data held in the status register to the system 21 via the data controller 11 and interface unit 8 according to the status command. That is, the status data of Pass or Fail held in the status register is transferred to the system 21.

The system 21 can determine whether the test result is Pass or Fail based on status data supplied from the NAND flash memory 31 (S18).

According to the high-speed data input test of the second embodiment, expected value data is generated in the NAND flash memory 31 according to an expected value generation command and held in data buffer UDL, test data supplied from the system 21 is transferred to data buffer XDL according to a test command, test data held in data buffer XDL is compared with expected value data held in data buffer UDL by means of the operation unit, status data indicating whether or not the compared data items coincide is supplied to the memory controller 9 and status data is read according to a status read command. Therefore, the NAND flash memory 31 is not required to output data held in data buffer XDL according to a low-speed clock signal at the test time. As a result, the test time can be reduced.

Further, like the first embodiment, the signal integrity can be precisely evaluated in the package/board on which the NAND flash memory 31 is mounted.

(High-Speed Data Output Test)

Figure 11:
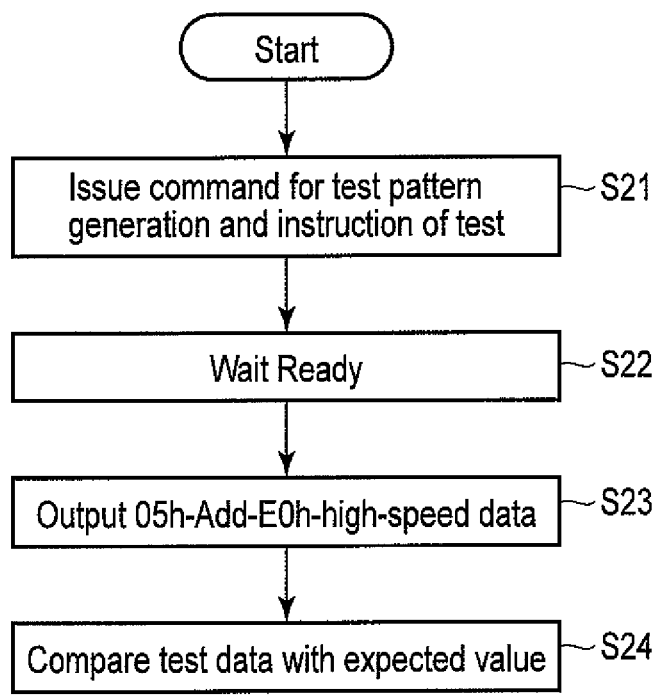
FIG. 11 is a flowchart for illustrating the high-speed data output test operation in the second embodiment.

FIG. 11 is a flowchart for illustrating the high-speed data output test operation in the second embodiment.

First, a command that instructs generation of a test pattern and execution of a test is issued from the system 21 (S21). The command interface contained in the interface unit 8 of the NAND flash memory 31 decodes a command issued from the system 21 and the memory controller 9 starts the test data generation operation according to the result of decoding in the command interface.

Specifically, the memory controller 9 controls the column address controller 7 and data controller 11 and supplies test data to data buffer XDL. That is, the memory controller 9 generates test data, for example, and the test data is supplied to data buffer XDL specified by the column address controller 7 via the data controller 11. The test data is the same as the test data of the high-speed data input test described above.

The NAND flash memory 31 is set to the Busy state and the R/B pin is set to the Busy state while the test data is being generated. Therefore, the system 21 is set to the standby state to wait until the R/B pin becomes Ready (S22).

If test data is transferred to data buffer XDL, a command sequence for outputting data is executed by means of the system 21 (S23). That is, data output command "05h", address Add and execution command "E0h" are sequentially issued.

The memory controller 9 of the NAND flash memory 31 transfers test data held in data buffer XDL to the system 21 via the data controller 11 and interface unit 8 according to a high-speed clock signal based on execution command "E0h".

The system 21 compares test data supplied from the NAND flash memory 31 with a previously held expected value and determines whether or not the compared data items coincide (S24).

According to the high-speed data output test of the second embodiment, test data is generated in the NAND flash memory 31 according to a test data generation command and held in data buffer XDL and test data held in data buffer XDL is transferred to the system 21 via the data controller 11 and interface unit 8 by means of a high-speed clock signal according to a test command. Therefore, since it is not required to transfer test data from the system 21 to data buffer XDL at the test time, the test time can be reduced.

Further, since data held in data buffer XDL is not data read from the memory cell but is data generated by means of the controller 9, the reliability of the circuit stretching from the interface unit 8 to the page buffer 4 can be determined even in a case wherein the reliability of the memory cell is not 100%. Therefore, the signal integrity can be precisely evaluated in the package/board on which the NAND flash memory 31 is mounted.

Third Embodiment

Figure 12:
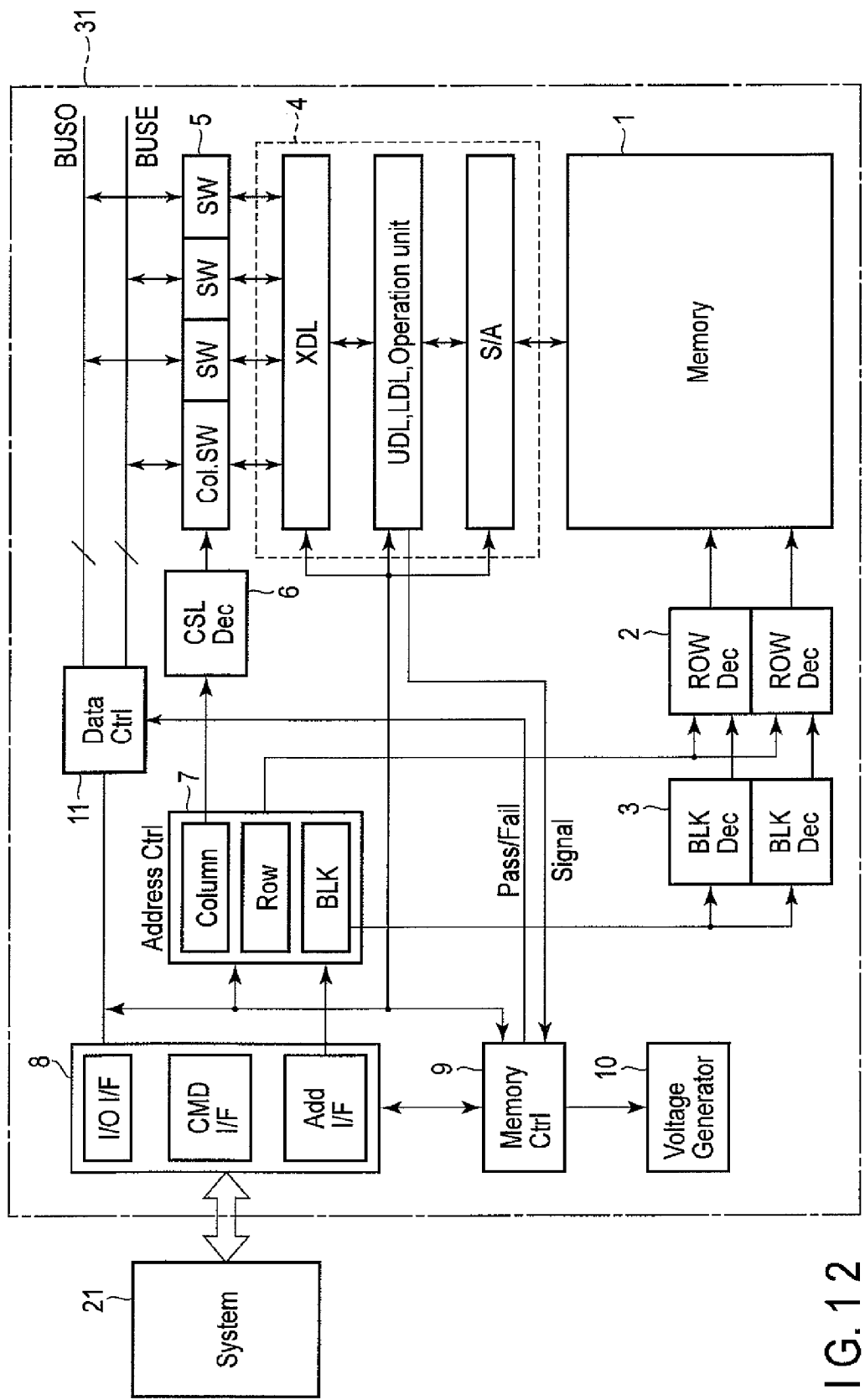
FIG. 12 is a configuration diagram showing a NAND flash memory according to a third embodiment.

FIG. 12 shows the configuration of a NAND flash memory 31 according to a third embodiment.

In the third embodiment, an interleaving operation is performed in the NAND flash memory 31 to realize a high-speed interface. That is, in FIG. 12, it is different from the case of FIG. 9 in that first and second data buses BUSE and BUSO are connected between a data controller 11 and column switch 5. First data bus BUSE is connected to even-numbered columns of data buffer XDL via the column switch 5 and second data bus BUSO is connected to odd-numbered columns of data buffer XDL via the column switch 5.

With the above configuration, for example, the data controller 11 alternately supplies data supplied from an interface unit 8 to first and second data buses BUSE and BUSO at the data input time to alternately transfer data to the even-numbered columns and odd-numbered columns of data buffer XDL via the column switch 5.

Further, at the data output time, the even-numbered columns and odd-numbered columns of data buffer XDL are alternately connected to first and second data buses BUSE and BUSO via the column switch 5 to transfer data of data buffer XDL to the interface unit 8 via the data controller 11.

Thus, the latency between the data controller 11 and data buffer XDL can be eased twice by alternately selecting first data bus BUSE connected to the even-numbered columns of data buffer XDL via the column switch 5 and second data bus BUSO connected to the odd-numbered columns of data buffer XDL via the column switch 5.

If attention is paid to first and second data buses BUSE and BUSO, first data bus BUSE always inputs or outputs "FFh" and second data bus BUSO always inputs or outputs "00h" when test data of the second embodiment is "FFh"-"00h"-"FFh"-"00h" and the pattern is not the worst pattern for high-speed data transfer.

In this case, it is adequate to use a pattern of "FFh"-"FFh"-"00h"-"00h"-"FFh"-"FFh"-"00h"-"00h" as a test pattern.

The test operation explained in the first and second embodiments can be applied to the NAND flash memory 31 shown in FIG. 12. Therefore, in the third embodiment, the signal integrity can be precisely evaluated in the package/board on which the NAND flash memory 31 is mounted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array;
   a first buffer;
   a second buffer;
   an interface unit, data being transferred between the interface unit and the first buffer; and
   a controller configured to control the first buffer, the second buffer and the interface unit;
   wherein the controller transfers first data to the first buffer via the interface unit when receiving the first data and a first command at a test time, reads second data from the memory cell array to the second buffer when receiving a second command as a dummy command and, at a same time, outputs the first data held in the first buffer via the interface unit;
   wherein the first data is transferred to the first buffer according to a first clock signal with a first frequency, and the first data is output from the first buffer via the interface unit according to a second clock signal with a second frequency higher than the first frequency at the test time.

2. A semiconductor memory device comprising:
a memory cell array;
a first buffer;
a second buffer;
an interface unit, data being transferred between the interface unit and the first buffer; and
a controller configured to control the first buffer, the second buffer and the interface unit;
wherein the controller generates expected value data according to a first command and causes the second buffer to hold the expected value data at a test time; and
wherein the controller transfers test data supplied via the interface unit to the first buffer according to a second command, compares the expected value data held in the second buffer with test data held in the first buffer according to a third command to hold a result of the comparison as status data, and outputs the status data according to a fourth command.

3. The device according to claim 2, wherein the test data is transferred to the first buffer according to a first clock signal with a first frequency.

4. A semiconductor memory device comprising:
a memory cell array;
a first buffer;
a second buffer;
an interface unit, data being transferred between the interface unit and the first buffer; and
a controller configured to control the first buffer, the second buffer and the interface unit;
wherein the controller generates test data according to a first command, causes the first buffer to hold the test data at a test time, and outputs the test data held in the first buffer via the interface unit according to a second command.

5. The device according to claim 4, wherein the test data is output from the first buffer according to a first clock signal with a first frequency.

6. A semiconductor memory device comprising:
a memory cell array;
a first buffer;
a second buffer;
an interface unit;
a data controller connected to the interface unit;
a first data bus and a second data bus connected to the data controller, the first data bus being connected to even-numbered columns of the first buffer and the second data bus being connected to odd-numbered columns of the first buffer; and
a controller configured to control the first buffer, the second buffer, the interface unit and the data controller;
wherein the data controller alternately selects the first and second buffers at a data input time and output time.

7. The device according to claim 6, wherein the controller generates expected value data according to a first command, causes the second buffer to hold the expected value data at a test time, transfers test data supplied via the interface unit to the first buffer according to a second command, compares the expected value data held in the second buffer with test data held in the first buffer according to a third command to hold a result of the comparison as status data, and outputs the status data according to a fourth command.

8. The device according to claim 7, wherein the test data is transferred to the first buffer according to a first clock signal with a first frequency.

9. The device according to claim 6, wherein the controller generates test data according to a first command, causes the first buffer to hold the test data, and outputs test data held in the first buffer via the interface unit according to a second command.

10. The device according to claim 9, wherein the test data is output from the first buffer according to a first clock signal with a first frequency.

* * * * *